United States Patent
Yang

(10) Patent No.: US 10,580,919 B2
(45) Date of Patent: Mar. 3, 2020

(54) SPACE SOLAR CELL ARRAYS WITH BLOCKING DIODES

(71) Applicant: SolAero Technologies Corp., Albuquerque, NM (US)

(72) Inventor: Lei Yang, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 56 days.

(21) Appl. No.: 15/835,140

(22) Filed: Dec. 7, 2017

(65) Prior Publication Data

US 2019/0181286 A1 Jun. 13, 2019

(51) Int. Cl.
*H01L 31/05* (2014.01)
*H01L 31/044* (2014.01)
*H01L 31/02* (2006.01)
*H01L 31/042* (2014.01)
*H02J 1/10* (2006.01)
*H05F 3/04* (2006.01)

(52) U.S. Cl.
CPC .... *H01L 31/0504* (2013.01); *H01L 31/02008* (2013.01); *H01L 31/02021* (2013.01); *H01L 31/042* (2013.01); *H01L 31/044* (2014.12); *H02J 1/108* (2013.01); *H05F 3/04* (2013.01)

(58) Field of Classification Search
None
See application file for complete search history.

(56) References Cited

U.S. PATENT DOCUMENTS

| 4,019,924 | A | 4/1977 | Kurth |
| 4,084,985 | A | 4/1978 | Evans, Jr. |
| 4,131,123 | A | 12/1978 | Della-Vedowa et al. |
| 4,409,537 | A | 10/1983 | Harris |
| 4,567,316 | A | 1/1986 | Hollaus et al. |
| 5,330,583 | A * | 7/1994 | Asai ................ H01L 31/048 136/244 |
| 5,688,337 | A | 11/1997 | Mosher |
| 6,194,651 | B1 * | 2/2001 | Stark ................ B64G 1/44 136/244 |
| 6,248,950 | B1 | 6/2001 | Hoeber et al. |
| 6,331,671 | B1 | 12/2001 | Makita et al. |
| 6,350,944 | B1 | 2/2002 | Sherif et al. |
| 6,903,260 | B2 | 6/2005 | Boulanger |
| 2004/0112419 | A1 | 6/2004 | Boulanger |

(Continued)

FOREIGN PATENT DOCUMENTS

| EP | 1705718 A1 | 9/2006 |
| JP | 06-275857 A | 9/1994 |

(Continued)

OTHER PUBLICATIONS

European Search Report for EP Patent Application No. 18151488.6, dated Jun. 20, 2018, 6 pages.

*Primary Examiner* — Devina Pillay

(57) ABSTRACT

A solar cell panel or assembly including a string of solar cells, each solar cell having an oblique cut corner defining a space; a blocking diode positioned in correspondence with the space defined by said oblique cut corner; a first contact member connecting said blocking diode with the solar cell; a second contact member to connect said blocking diode to a metal bus bar; and a resistive element, connected in parallel to the blocking diode, between the first and the second contact members.

20 Claims, 6 Drawing Sheets

(56) References Cited

U.S. PATENT DOCUMENTS

| | | | |
|---|---|---|---|
| 2008/0117631 A1* | 5/2008 | Kim | G02F 1/133608 |
| | | | 362/249.12 |
| 2011/0073150 A1 | 3/2011 | Hightower et al. | |
| 2012/0133208 A1 | 5/2012 | Kalhoff et al. | |
| 2012/0152330 A1* | 6/2012 | Nakatani | H01L 31/02008 |
| | | | 136/251 |
| 2012/0160297 A1 | 6/2012 | Yamakawa et al. | |
| 2016/0218665 A1* | 7/2016 | Crist | H01L 31/0504 |
| 2017/0133983 A1 | 5/2017 | Moslehi et al. | |
| 2017/0222081 A1 | 8/2017 | Koakutsu | |

FOREIGN PATENT DOCUMENTS

| | | |
|---|---|---|
| JP | 10-319851 A | 12/1998 |
| JP | 11-274542 A | 10/1999 |
| JP | 2000-91617 A | 3/2000 |
| JP | 2001-267617 A | 9/2001 |
| WO | 00/14849 A1 | 3/2000 |
| WO | 02/074623 A1 | 9/2002 |

* cited by examiner

SPACE SOLAR CELL ARRAYS WITH BLOCKING DIODES

REFERENCE TO RELATED APPLICATIONS

This application is related to U.S. patent application Ser. No. 14/602,892, filed Jan. 22, 2015, which is incorporated herein by reference in its entirety.

BACKGROUND OF THE INVENTION

Field of the Invention

The present disclosure relates to space-qualified solar cell arrays and the fabrication of such solar cell arrays, and more particularly to the design and specification of blocking diodes associated with strings of solar cells mounted on panels for space missions.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 29.5% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads use increasing amounts of power as they become more sophisticated, and missions and applications are anticipated for five, ten, twenty or more years, the power-to-weight ratio and lifetime efficiency of a solar cell becomes increasingly more important. There is increasing interest to increase not only the amount of power provided at initial deployment, but over the entire service life of the satellite system, or in terms of a design specification, the amount of power provided at the "end of life" (EOL) which is affected by the radiation exposure of the solar cell over time in a space environment.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current after the sunlight impinges on the front of the solar cell, and photons pass through the subcells, with each subcell being designed for photons in a specific wavelength band. After passing through a subcell, the photons that are not absorbed and converted to electrical energy propagate to the next subcells, where such photons are intended to be captured and converted to electrical energy.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current needed by the payload or subcomponents of the payload, the amount of electrical storage capacity (batteries) on the spacecraft, and the power demands of the payloads during different orbital configurations.

A solar cell designed for use in a space vehicle (such as a satellite, space station, or an interplanetary mission vehicle), has a sequence of subcells with compositions and band gaps which have been optimized to achieve maximum energy conversion efficiency for the AM0 solar spectrum in space. The AM0 solar spectrum in space is notably different from the AM1.5 solar spectrum at the surface of the earth, and accordingly terrestrial solar cells are designed with subcell band gaps optimized for the AM1.5 solar spectrum.

There are substantially more rigorous qualification and acceptance testing protocols used in the manufacture of space solar cells to ensure that space solar cells can operate satisfactorily at the wide range of temperatures and temperature cycles encountered in space. These testing protocols include (i) high-temperature thermal vacuum bake-out; (ii) thermal cycling in vacuum (TVAC) or ambient pressure nitrogen atmosphere (APTC); and in some applications (iii) exposure to radiation equivalent to that which would be experienced in the space mission, and measuring the current and voltage produced by the cell and deriving cell performance data.

As used in this disclosure and claims, the term "space-qualified" shall mean that the electronic component (i.e., the solar cell) provides satisfactory operation under the high temperature and thermal cycling test protocols. The exemplary conditions for vacuum bake-out testing include exposure to a temperature of +100° C. to +135° C. (e.g., about +100° C., +110° C., +120° C., +125° C., +135° C.) for 2 hours to 24 hours, 48 hours, 72 hours, or 96 hours; and exemplary conditions for TVAC and/or APTC testing that include cycling between temperature extremes of −180° C. (e.g., about −180° C., −175° C., −170° C., −165° C., −150° C., −140° C., −128° C., −110° C., −100° C., −75° C., or −70° C.) to +145° C. (e.g., about +70° C., +80° C., +90° C., +100° C., +110° C., +120° C., +130° C., +135° C., or +145° C.) for 600 to 32,000 cycles (e.g., about 600, 700, 1500, 2000, 4000, 5000, 7500, 22000, 25000, or 32000 cycles), and in some space missions up to +180° C. See, for example, Fatemi et al., "Qualification and Production of Emcore ZTJ Solar Panels for Space Missions," Photovoltaic Specialists Conference (PVSC), 2013 IEEE 39th (DOI: 10. 1109/PVSC 2013 6745052). Such rigorous testing and qualifications are not generally applicable to terrestrial solar cells and solar cell arrays.

The space solar cells and arrays experience a variety of complex environments in space missions, including the vastly different illumination levels and temperatures seen during normal earth orbiting missions, as well as even more challenging environments for deep space missions, operating at different distances from the sun, such as at 0.7, 1.0 and 3.0 AU (AU meaning astronomical units), or in other words, distances from the sub of respectively 104.7 million km, 149.6 million km and 448.8 million km respectively. The photovoltaic arrays also endure anomalous events from space environmental conditions, and unforeseen environmental interactions during exploration missions. Hence, electron and proton radiation exposure, collisions with space debris, and/or normal aging in the photovoltaic array and other systems could cause suboptimal operating conditions that degrade the overall power system performance, and may result in failures of one or more solar cells or array strings and consequent loss of power.

A further distinctive difference between space solar cell arrays and terrestrial solar cell arrays is that a space solar cell array utilizes welding and not soldering to provide robust electrical interconnections between the solar cells, while terrestrial solar cell arrays typically utilize solder for electrical interconnections. Welding is required in space solar cell arrays to provide the very robust electrical connections that can withstand the wide temperature ranges and temperature cycles encountered in space such as from −175° C. to +180° C. In contrast, solder joints are typically sufficient to survive the rather narrow temperature ranges (e.g., about −40° C. to about +50° C.) encountered with terrestrial solar cell arrays.

A further distinctive difference between space solar cell arrays and terrestrial solar cell arrays is that a space solar cell array utilizes silver-plated metal material for interconnection members, while terrestrial solar cells typically utilize copper wire for interconnects. In some embodiments, the interconnection member can be, for example, a metal plate. Useful metals include, for example, molybdenum; a nickel-cobalt ferrous alloy material designed to be compatible with the thermal expansion characteristics of borosilicate glass such as that available under the trade designation KOVAR from Carpenter Technology Corporation; a nickel iron alloy material having a uniquely low coefficient of thermal expansion available under the trade designation Invar, FeNi36, or 64FeNi; or the like.

An additional distinctive difference between space solar cell arrays and terrestrial solar cell arrays is that space solar cell arrays typically utilize an aluminum honeycomb panel for a substrate or mounting platform. In some embodiments, the aluminum honeycomb panel may include a carbon composite face sheet adjoining the solar cell array. In some embodiments, the face sheet may have a coefficient of thermal expansion (CTE) that substantially matches the CTE of the bottom germanium (Ge) layer of the solar cell that is attached to the face sheet. Substantially matching the CTE of the face sheet with the CTE of the Ge layer of the solar cell can enable the array to withstand the wide temperature ranges encountered in space without the solar cells cracking, delaminating, or experiencing other defects. Such precautions are generally unnecessary in terrestrial applications.

Thus, a further distinctive difference of a space solar cell from a terrestrial solar cell is that the space solar cell must include a cover glass over the semiconductor device to provide radiation resistant shielding from particles in the space environment which could damage the semiconductor material. The cover glass is typically a ceria doped borosilicate glass which is typically from three to six mils (0.0762 to 0.1524 mm) in thickness and attached by a transparent adhesive to the solar cell.

In summary, it is evident that the differences in design, materials, and configurations between a space-qualified III-V compound semiconductor solar cell and subassemblies and arrays of such solar cells, on the one hand, and silicon solar cells or other photovoltaic devices used in terrestrial applications, on the other hand, are so substantial that prior teachings associated with silicon or other terrestrial photovoltaic system are simply unsuitable and have no applicability to the design configuration of space-qualified solar cells and arrays. Indeed, the design and configuration of components adapted for terrestrial use with its modest temperature ranges and cycle times often teach away from the highly demanding design requirements for space-qualified solar cells and arrays and their associated components.

The assembly of individual solar cells together with electrical interconnects and the cover glass form a so-called "CIC" (Cell-Interconnected-Cover glass) assembly, which are then typically electrically connected to form an array of series-connected solar cells. The solar cells used in many arrays often have a substantial size; for example, in the case of the single standard substantially "square" solar cell trimmed from a 100 mm wafer with cropped corners, the solar cell can have a side length of seven cm or more.

The radiation hardness of a solar cell is defined as how well the cell performs after exposure to the electron or proton particle radiation which is a characteristic of the space environment. A standard metric is the ratio of the end of life performance (or efficiency) divided by the beginning of life performance (EOL/BOL) of the solar cell. The EOL performance is the cell performance parameter after exposure of that test solar cell to a given fluence of electrons or protons (which may be different for different space missions or orbits). The BOL performance is the performance parameter prior to exposure to the particle radiation.

Charged particles in space could lead to damage to solar cell structures, and in some cases, dangerously high voltage being established across individual devices or conductors in the solar array. These large voltages can lead to catastrophic electrostatic discharging (ESD) events. Traditionally for ESD protection the backside of a solar array may be painted with a conductive coating layer to ground the array to the space plasma, or one may use a honeycomb patterned metal panel which mounts the solar cells and incidentally protects the solar cells from backside radiation.

The radiation hardness of the semiconductor material of the solar cell itself is primarily dependent on a solar cell's minority carrier diffusion length ($L_{min}$) in the base region of the solar cell (the term "base" region referring to the p-type base semiconductor region disposed directly adjacent to an n-type "emitter" semiconductor region, the boundary of which establishes the p-n photovoltaic junction). The less degraded the parameter $L_{min}$ is after exposure to particle radiation, the less the solar cell performance will be reduced. A number of strategies have been used to either improve $L_{min}$, or make the solar cell less sensitive to $L_{min}$ reductions. Improving $L_{min}$ has largely involved including a gradation in dopant elements in the semiconductor base layer of the subcells so as to create an electric field to direct minority carriers to the junction of the subcell, thereby effectively increasing $L_{min}$. The effectively longer $L_{min}$ will improve the cell performance, even after the particle radiation exposure. Making the cell less sensitive to $L_{min}$ reductions has involved increasing the optical absorption of the base layer such that thinner layers of the base can be used to absorb the same amount of incoming optical radiation.

Another consideration in connection with the manufacture of space solar cell arrays is that conventionally, solar cells have been arranged on a support and interconnected using a substantial amount of manual labor. For example, first individual CICs are produced with each interconnect individually welded to the solar cell, and each cover glass individually mounted. Then, these CICs are connected in series to form strings, generally in a substantially manual manner, including the welding steps from CIC to CIC. Then, these strings are applied to a panel substrate and electrically interconnected in a process that includes the application of adhesive, wiring, etc. All of this has traditionally been carried out in a manual and substantially artisanal manner.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as the effect of its exposure to radiation in the ambient environment over time. The identification and specification of such design parameters is a non-trivial engineering undertaking, and would vary depending upon the specific space mission and customer design requirements. Since the power output is a function of both the voltage and the current produced by a subcell, a simplistic view may seek to maximize both parameters in a subcell by increasing a constituent element, or the doping level, to achieve that effect. However, in reality, changing a material parameter that increases the voltage may result in a decrease in current, and therefore a lower power output. Such material design parameters are interdependent and interact in complex and often unpredictable ways, and for that reason are not "result effective" variables that those skilled in the art confronted with complex design specifications and practical operational considerations can easily adjust to optimize performance.

Moreover, the current (or more precisely, the short circuit current density $J_{sc}$) and the voltage (or more precisely, the open circuit voltage $V_{oc}$) are not the only factors that determine the power output of a solar cell. In addition to the power being a function of the short circuit density ($J_{sc}$), and the open circuit voltage ($V_{oc}$), the output power is actually computed as the product of $V_{oc}$ and $J_{sc}$, and a Fill Factor (FF). As might be anticipated, the Fill Factor parameter is not a constant, but in fact may vary at a value between 0.5 and somewhat over 0.85 for different arrangements of elemental compositions, subcell thickness, and the dopant level and profile. Although the various electrical contributions to the Fill Factor such as series resistance, shunt resistance, and ideality (a measure of how closely the semiconductor diode follows the ideal diode equation) may be theoretically understood, from a practical perspective the actual Fill Factor of a given subcell cannot always be predicted, and the effect of making an incremental change in composition or band gap of a layer may have unanticipated consequences and effects on the solar subcell semiconductor material, and therefore an unrecognized or unappreciated effect on the Fill Factor. Stated another way, an attempt to maximize power by varying a composition of a subcell layer to increase the $V_{oc}$ or $J_{sc}$ or both of that subcell, may in fact not result in high power, since although the product $V_{oc}$ and $J_{sc}$ may increase, the FF may decrease and the resulting power also decrease. Thus, the $V_{oc}$ and $J_{sc}$ parameters, either only or in combination, are not necessarily "result effective" variables.

Furthermore, the fact that the short circuit current density ($J_{sc}$), the open circuit voltage ($V_{oc}$), and the fill factor (FF), are affected by the slightest change in such design variables, the purity or quality of the chemical pre-cursors, or the specific process flow and fabrication equipment used, and such considerations further complicates the proper specification of design parameters and predicting the efficiency of a proposed design which may appear "on paper" to be advantageous.

It must be further emphasized that in addition to process and equipment variability, the "fine tuning" of minute changes in the composition, band gaps, thickness, and doping of every layer in the arrangement has critical effect on electrical properties such as the open circuit voltage ($V_{oc}$) and ultimately on the power output and efficiency of the solar cell.

To illustrate the practical effect, consider a design change that results in a small change in the $V_{oc}$ of an active layer in the amount of 0.01 volts, for example changing the $V_{oc}$ from 2.72 to 2.73 volts. Assuming all else is equal and does not change, such a relatively small incremental increase in voltage would typically result in an increase of solar cell efficiency from 29.73% to 29.84% for a triple junction solar cell, which would be regarded as a substantial and significant improvement that would justify implementation of such design change.

For a single junction GaAs subcell in a triple junction device, a change in $V_{oc}$ from 1.00 to 1.01 volts (everything else being the same) would increase the efficiency of that junction from 10.29% to 10.39%, about a 1% relative increase. If it were a single junction stand-alone solar cell, the efficiency would go from 20.58% to 20.78%, still about a 1% relative improvement in efficiency.

Present day commercial production processes are able to define and establish band gap values of epitaxially deposited layers as precisely as 0.01 eV, so such "fine tuning" of compositions and consequential open circuit voltage results are well within the range of operational production specifications for commercial products.

Another important mechanical or structural consideration in the choice of semiconductor layers for a solar cell is the desirability of the adjacent layers of semiconductor materials in the solar cell, i.e. each layer of crystalline semiconductor material that is deposited and grown to form a solar subcell, have similar or substantially similar crystal lattice constants or parameters.

Here again there are trade-offs between including specific elements in the composition of a layer which may result in improved voltage associated with such subcell and therefore potentially a greater power output, and deviation from exact crystal lattice matching with adjoining layers as a consequence of including such elements in the layer which may result in a higher probability of defects, and therefore lower manufacturing yield.

In that connection, it should be noted that there is no strict definition of what is understood to mean two adjacent layers are "lattice matched" or "lattice mismatched". For purposes in this disclosure, "lattice mismatched" refers to two adjacently disposed materials or layers (with thicknesses of greater than 100 nm) having in-plane lattice constants of the materials in their fully relaxed state differing from one another by less than 0.02% in lattice constant. (Applicant notes that this definition is considerably more stringent than that proposed, for example, in U.S. Pat. No. 8,962,993, which suggests less than 0.6% lattice constant difference as defining "lattice mismatched" layers).

Bypass diodes are frequently used for each solar cell in solar cell arrays comprising a plurality of series connected solar cells or groups of solar cells. One reason for this is that if one of the solar cells or groups of solar cells is shaded or damaged, the current produced by other solar cells in the series connected array, such as by unshaded or undamaged solar cells or groups of solar cells will flow through the series connected solar cells, and in reaching the shaded solar cell, will flow through the bypass diode instead of through the respective solar cell, since the bypass diode is connected in parallel with the solar cell and thus avoid the high resistance of the shaded or damaged solar cell or group of solar cells.

When all of the solar cells in an array are receiving sunlight or are illuminated, each solar cell will be forward biased. However, if any of the solar cells are not illuminated, because of shadowing or damage, those cells may become reversed biased in order to carry the current generated by the illuminated cells. This reverse biasing can degrade the cells and can ultimately render the cells inoperable. In order to prevent reverse biasing, a bypass diode is often connected in parallel with the solar cell.

The purpose of the bypass diode is to draw the current away from the shadowed or damaged cell. Since the bypass diode is in parallel with the solar cell, the current flows through the bypass diode and it becomes forward biased when the shadowed cell becomes reverse biased. Rather than forcing current through the shadowed cell, which would occur in the absence of a bypass diode, the diode draws the current away from the shadowed cell and maintains the series electrical connection to the next cell.

Different types of bypass diodes have been utilized in prior art. One conventional method to provide bypass diode protection to a solar cell array has been to connect a bypass diode between adjacent cells, with the anode of the bypass diode connected to one solar cell and the cathode of the diode connected to an adjoining solar cell. However, this technique is complicated to manufacture and requires a very difficult and inefficient assembly method. Another technique for providing a bypass diode for each cell involves a recess next to each solar cell and a bypass diode being placed into this recess and connected in parallel with the solar cell to which it is attached.

Placing the bypass diodes at the cropped corners of the solar cells can be an efficient solution as it makes use of a space that is not used for converting solar energy into electrical energy. As a solar cell array or solar panel often includes a large number of solar cells, and often a correspondingly large number of bypass diodes, the efficient use of the area at the cropped corners of individual solar cells adds up and can represent an important enhancement of the efficient use of space in the overall solar cell assembly.

In addition to the bypass diodes which is typically associated with each solar cell, a solar cell array or panel also incorporates a blocking diode that functions to prevent reverse currents generated by other arrays which are connected to the panel during the time when the output voltage from a solar cell or a group of series connected solar cells is low, for example, in the absence of sun.

Generally, only one blocking diode is provided for each set or string of series connected solar cells, and the blocking diode is connected in series with this string of solar cells. The blocking diode is normally forward biased during normal string operation, which functionally distinguishes it from the bypass diode which is normally reverse biased during normal operation.

Often, since a panel includes a relatively large amount of solar cells that are connected in series, a relatively substantial blocking diode is required, in terms of size and electrical capacity. The blocking diode is generally connected to the string of solar cells at the end of the string. As the blocking diode is generally only present at the end of the string, not much attention has been paid to the way in which it is shaped and connected, as this has not been considered to be of major relevance for the overall efficiency of the solar cell assembly. Standard diode components have been used.

In US2016/0218665 it has been proposed to place a blocking diode in a space defined by an oblique cut corner of the solar cell at the end of the string to make efficient use of the free space.

SUMMARY

Features of the Disclosure

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 1.6, or 1.3 to 1.4, or 1.5 to 1.9 eV.

Briefly, and in general terms, the present disclosure provides a solar cell array comprising: a support including first and second terminals of opposite polarity type; a string of series connected space-qualified solar cells arranged between the first and second terminals generating a peak voltage between 10 and 1000 volts; a blocking diode having a first terminal connected with one end of the string of series connected solar cells and a second terminal connected to the first terminal of the string of series connected solar cells; and a resistive element connected in parallel to the blocking diode, between the first terminal and said one end of the string of series connected solar cells for providing a leakage current path in parallel with the blocking diode so as to prevent an electrostatic discharge between the terminals of the blocking diode.

In space application, the tendency to increase the number of cells and the need to reduce space usage as much as possible has led to previously unforeseen problems, such as static discharge between the terminals of the blocking diode. This problem can be avoided by the resistive element in parallel with the blocking diode.

In some embodiments, the ohmic value of the resistive element is between 1K and 100M Ohm, and has a leakage current of from 10 microAmps to 10 milliAmps.

In some embodiments, the ohmic value of the resistive element is between 80K and 120K Ohm, and has a leakage current of from 0.5 to 1.5 milliAmps.

In some embodiments, the blocking diode is a planar diode having a terminal of first polarity on a first surface, and a terminal of second polarity on the opposite second surface of the planar diode and the surfaces are separated by distances in the range of 0.1 mm to 2.0 mm.

In some embodiments, the planar blocking diode has a substantially triangular shape. Such a blocking diode may be arranged in the triangular space of a cropped corner of an individual cell.

In some embodiments, the resistive element is a resistive paste positioned in parallel to the blocking diode in a portion of the triangular space and making contact with the first and second surfaces of the planar diode. The resistive paste may have a thickness between 3 and 6 mm By providing the resistive element in the form of a paste in a portion of the triangular space, no extra space is occupied.

In some embodiments, the resistive element is a discrete packaged resistive element. By providing the resistive element in the form of a discrete packaged resistive element no modifications may be required to the blocking diode and the resistive element may even be added to solar cell arrays with no resistive element present.

In some embodiments, the distance between the first and second terminals of the blocking diode is less than 2 mm.

In some embodiments, the resistive paste is composed of carbon nanotubes. For example, a solution of carbon nanotubes may be dispersed uniformly in the triangular space and then dried to form a carbon nanotube resistor.

In some embodiments, the resistive paste is an electrically conductive silicone material having a volume resistivity of 25 ohm-cm.

In another aspect, the present disclosure provides a solar cell assembly comprising: a first string of series connected first space-qualified solar cells, one of said first solar cells being a final first solar cell of the first string, said final first solar cell having a metal layer and at least a first oblique cut corner and a second oblique cut corner; and a first contact member electrically connected to said metal layer of said final first solar cell; through a first blocking diode electrically connected in series, wherein a first terminal of said first blocking diode is electrically connected through a first interconnect to the first contact member, and a second terminal of said first blocking diode of opposite polarity is directly electrically connected to a first connector that is also directly electrically connected to said metal layer of said final first solar cell at said first oblique cut corner, with the first blocking diode being positioned in the region defined by said first oblique cut corner; and a resistive element connected in parallel with the first blocking diode to provide a small current leakage path to prevent an electrostatic discharge across the terminals of the first blocking diode arising from the array operating in the space environment where electron and proton particle irradiation is experienced.

Some embodiments may further comprise a second blocking diode electrically connected in series, wherein a first terminal of said second blocking diode is electrically connected through a second interconnect to the first contact member, and a terminal of said blocking diode of opposite polarity is directly electrically connected to the first connector that is also directly electrically connected to said metal layer of said final solar cell at said second oblique cut corner, with the second blocking diode being positioned in the region defined by said second oblique cut corner.

In some embodiments, the first blocking diode is a planar diode having a terminal of first polarity on a first surface, and a terminal of second polarity on the opposite second surface of the planar diode and the surfaces are separated by distances in the range of 0.1 mm to 2.0 mm, and has a substantially triangular shape adapted to fit into a space left free by said first oblique cut corner, and the ohmic value of the resistive element is between 1K and 100M Ohm, and has a leakage current of from 10 microAmps to 10 milliAmps.

In some embodiments, said first contact member is a metal bus bar, and the resistive element is a conductive polyimide film.

In some embodiments, there further comprises a second string of series connected second solar cells, one of said second solar cells being a final second solar cell of the second string having a metal layer and at least one oblique cut corner, said final second solar cell being connected to a second contact member through a third blocking diode electrically connected in series, wherein a first connection of said third blocking diode is electrically connected through a third interconnect to the second contact member, and a second connection of said third blocking diode is directly electrically connected to a second connector that is also directly electrically connected to said metal layer of said final second solar cell at said at least one oblique cut corner, with the third blocking diode being positioned proximate said at least one oblique cut corner, the final first solar cell and the final second solar cell being placed adjacent to each other, and said first blocking diode and said third blocking diode being placed adjacent to each other.

In some embodiments, the first blocking diode and said third blocking diode each have a substantially triangular or rectangular shape and have surfaces separated by a distance between 0.1 mm and 1.0 mm.

In another aspect, the present disclosure provides a solar cell assembly comprising a plurality of solar cells arranged adjacent to each other in rows and columns forming an array, each solar cell having a substantially rectangular shape with four oblique cut corners, each solar cell of the plurality of said solar cells being connected to a bypass diode arranged in correspondence with a first oblique cut corner of the respective solar cell and arranged in a space provided between adjacent solar cells at the oblique cut corners of the solar cells, said solar cell assembly further comprising at least a first contact member arranged to collect current from a first portion of the plurality of said solar cells that are arranged in series to form a first string, at least one solar cell having a metal layer and being electrically connected to said first contact member (i) through a first blocking diode electrically connected in series, wherein a first connection of said first blocking diode is electrically connected through a first interconnect to said first contact member, and a second connection of said first blocking diode is directly electrically connected to a first connector that is also directly electrically connected to said metal layer of the at least one solar cell at a second oblique cut corner, the first blocking diode being placed in a space provided between said at least one solar cell and the first contact member, adjacent the second oblique cut corner of said at least one solar cell; and (ii) through a second blocking diode electrically connected in series, wherein a first connection of said second blocking diode is electrically connected through a second interconnect to said first contact member, and a second connection of said second blocking diode is directly electrically connected to the first connector that is also directly electrically connected to said metal layer of the at least one solar cell at a third oblique cut corner, the second blocking diode being placed in a space provided between said at least one solar cell and the first contact member, adjacent the third oblique cut corner of said at least one solar cell.

In some embodiments, there further comprises a second contact member arranged to collect current from a second portion of the plurality of said solar cells that are arranged in series to form a second string, at least one solar cell of the second string having a metal layer and being connected to said second contact member through a third blocking diode electrically connected in series, wherein a first connection of said third blocking diode is electrically connected through a third interconnect to said second contact member, and a second connection of said third blocking diode is directly electrically connected to a second connector that is also directly electrically connected to the metal layer of the at least one solar cell of the second string at a second oblique cut corner, the third blocking diode being placed in a space provided between said at least one solar cell of the second string and the second contact member, adjacent the second oblique cut corner of said at least one solar cell of the second string, wherein the first and third blocking diodes are placed in a space between two adjacent solar cells belonging to the first string and the second string.

In some embodiments, the resistive element is positioned in parallel to the blocking diode in a portion of the triangular space and making contact with the first and second surfaces of the planar diode, the resistive element having a thickness between 3 and 6 mm, and comprising an electrically conductive silicone material having a volume resistivity of 25 ohm-cm.

In another aspect, the present disclosure provides a method of fabricating a space-qualified solar cell array comprising: providing a panel having first and second terminals of opposite polarity type; implementing on the panel a string of series-connected space-qualified solar cells arranged between the first and second terminals, the string of solar cells generating a peak voltage between 10 and 1000 volts; arranging a blocking diode on the panel and having a first terminal connected with one end of the string of series connected solar cells and a second terminal connected to the first terminal of the string of series connected solar cells; and providing a resistive element connected in parallel to the blocking diode, between the first terminal and said one end of the string of series connected solar cells for providing a leakage current path in parallel with the blocking diode so as to prevent an electrostatic discharge between the terminals of the blocking diode due to the characteristics of the space environment in which the array is deployed.

BRIEF DESCRIPTION OF THE DRAWINGS

Non-limiting examples of the present disclosure will be described in the following, with reference to the appended drawings, in which.

DETAILED DESCRIPTION OF EXAMPLES

Figure 1:
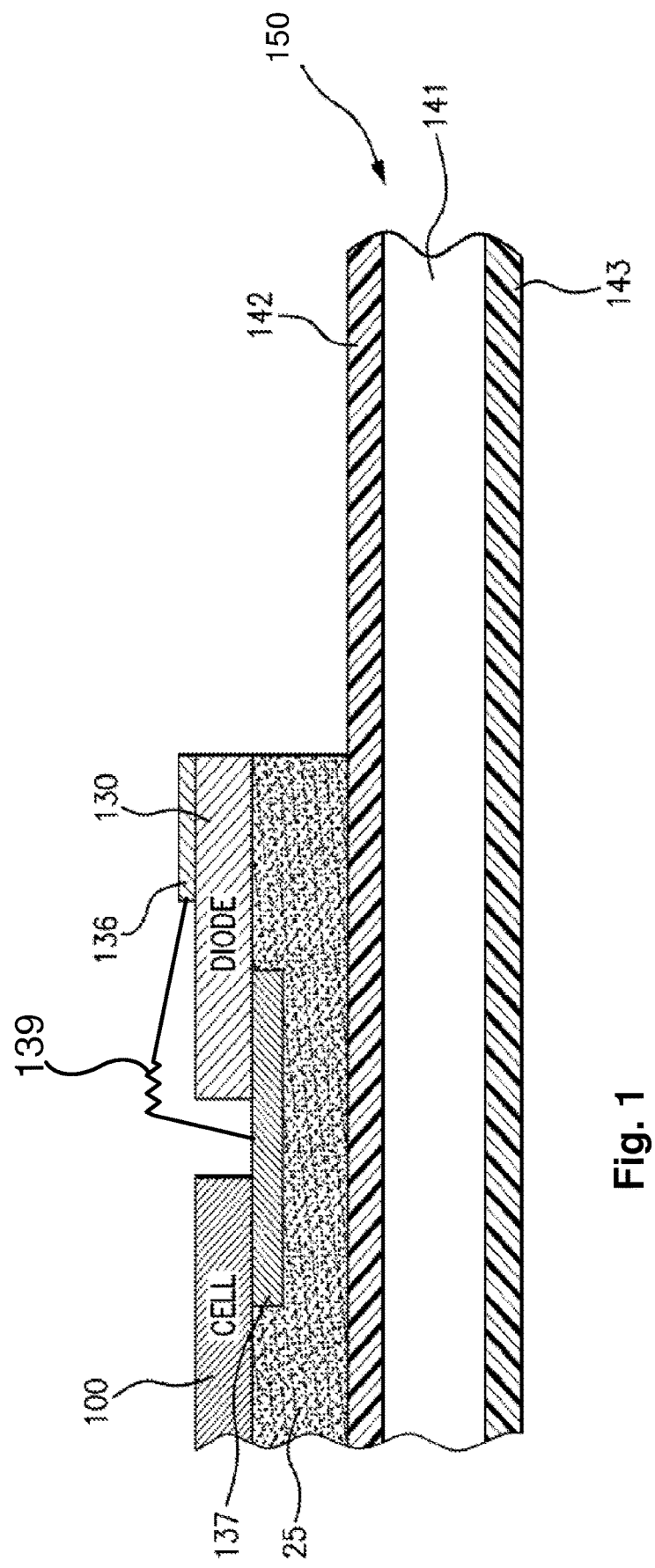
FIG. 1 schematically illustrates a cross-sectional view of a solar cell at a corner featuring a blocking diode and a resistive element, according to an example.
Figure 2A:
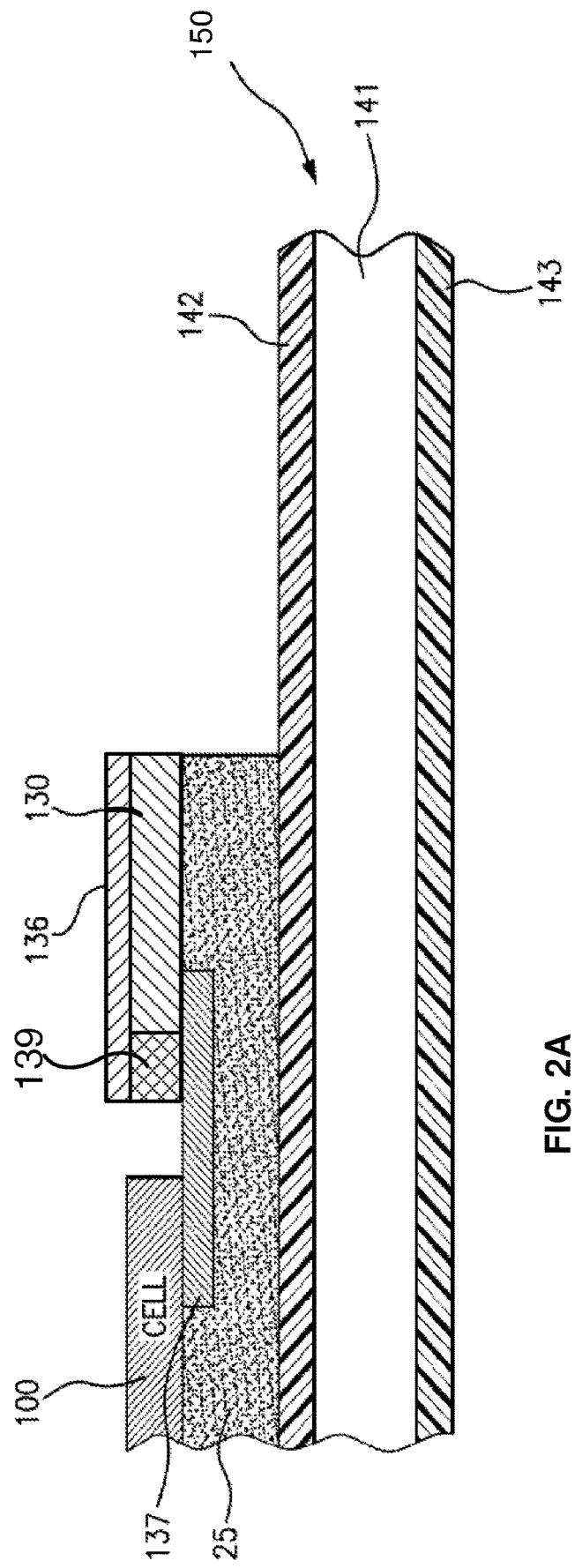
FIG. 2A schematically illustrates a cross-sectional view of a solar cell at a corner featuring a blocking diode and a resistive element, according to another example, with the resistive element adjacent to a blocking diode.
Figure 2B:
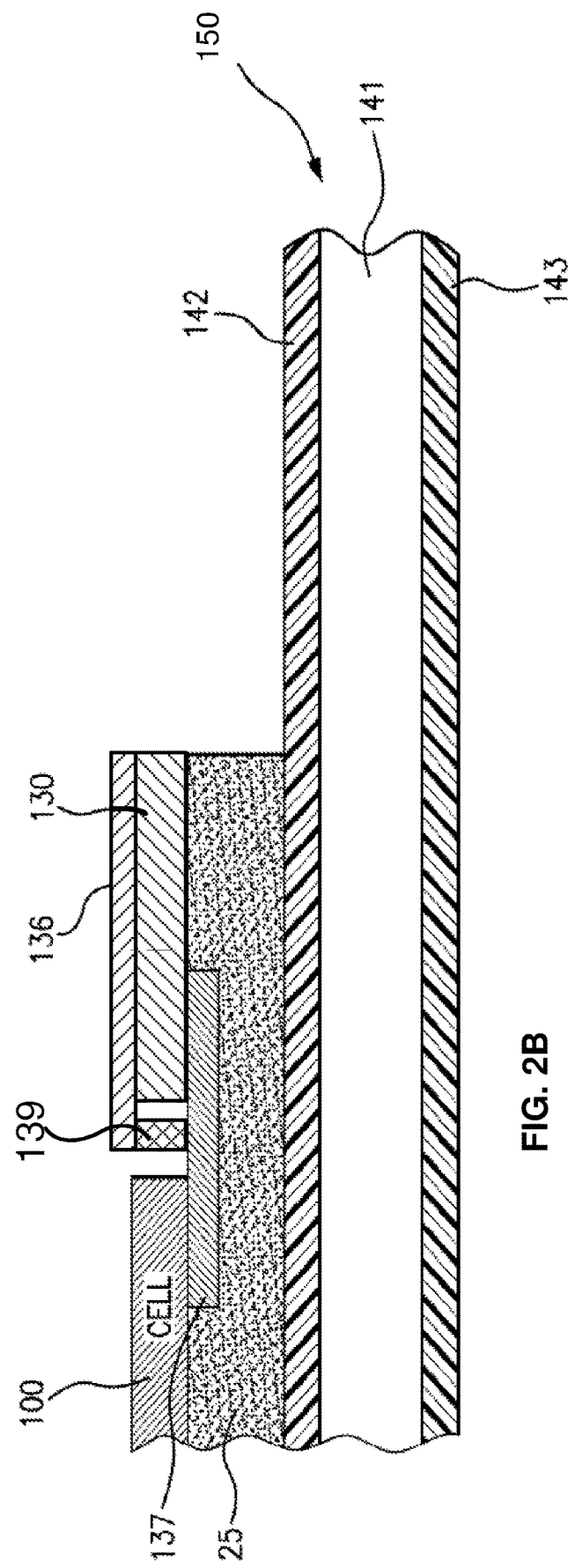
FIG. 2B schematically illustrates a cross-sectional view of a solar cell at a corner featuring a blocking diode and a resistive element, according to another example, with the resistive element spaced apart from a blocking diode.

FIGS. 1, 2A and 2B are cross sectional views of a solar cell featuring a blocking diode and a resistive element. FIGS. 1, 2A and 2B illustrate how, in accordance with embodiments of the disclosure, the solar cell can be positioned on a laminar support 150 comprising three layers 141, 142 and 143, to which the solar cell 100 is joined by an adhesive layer 25. The blocking diode 130 is connected to the solar cell 100 by means of a connector or terminal 137 which in some embodiments is dispersed in a cut-out region of the adhesive layer 25. The blocking diode 130 includes a terminal 136 by means of which the terminal 136 of the blocking diode can be connected to a metal bus bar. A resistive element 139 is connected in parallel to the diode between the terminal 136 and the terminal 137. The resistive element 139 may provide escape route to currents between the terminals 136 and 137 that would otherwise cause a discharge through the diode. The risk of such a discharge increases with the increase of the length of the string of solar cells (increasing the peak voltage), and with the reduction of thickness of the blocking diode. The resistive element may be of a "high" value so that, during normal operation, the current would flow through the diode and only a small portion would pass through the resistive element. Thus the resistive element would be used mainly during an overvoltage situation.

In FIG. 1 the resistive element 139 is external and connected in parallel to the blocking diode 130. For example, the resistive element may be a discrete packaged resistive element. In FIG. 2A the resistive element 139 is adjacent to the blocking diode 130 and in the same space as the blocking diode. For example, the space may be a triangular space and the blocking diode 130 may be a planar blocking diode. The resistive element 139 may be in the form of a resistive paste. The resistive paste may be positioned in parallel to the planar blocking diode in a portion of the triangular space and may be in contact with the planar blocking diode. In FIG. 2B the resistive element 139 may be in the same triangular space as the blocking diode 130. A gap may be present between the resistive paste and the blocking diode. That is, the resistive paste and the blocking diode may not be in contact. In the examples of FIGS. 2A and 2B, the resistive paste may have a thickness of between 3 and 6 mm.

In some embodiments, the ohmic value of the resistive element is between 1K and 100M Ohm, and has a leakage current of from 10 microAmps to 10 milliAmps.

In some embodiments, the ohmic value of the resistive element is between 80K and 120K Ohm, and has a leakage current from 0.5 to 1.5 milliAmps.

In some embodiments, the ohmic value of the resistive element is between 90K and 110K Ohm, and has a leakage current of from 0.8 to 1.2 milliAmps.

In some embodiments, the ohmic value of the resistive element is between 100K Ohm, and has a leakage current of 1.0 milliAmps.

Figure 3A:
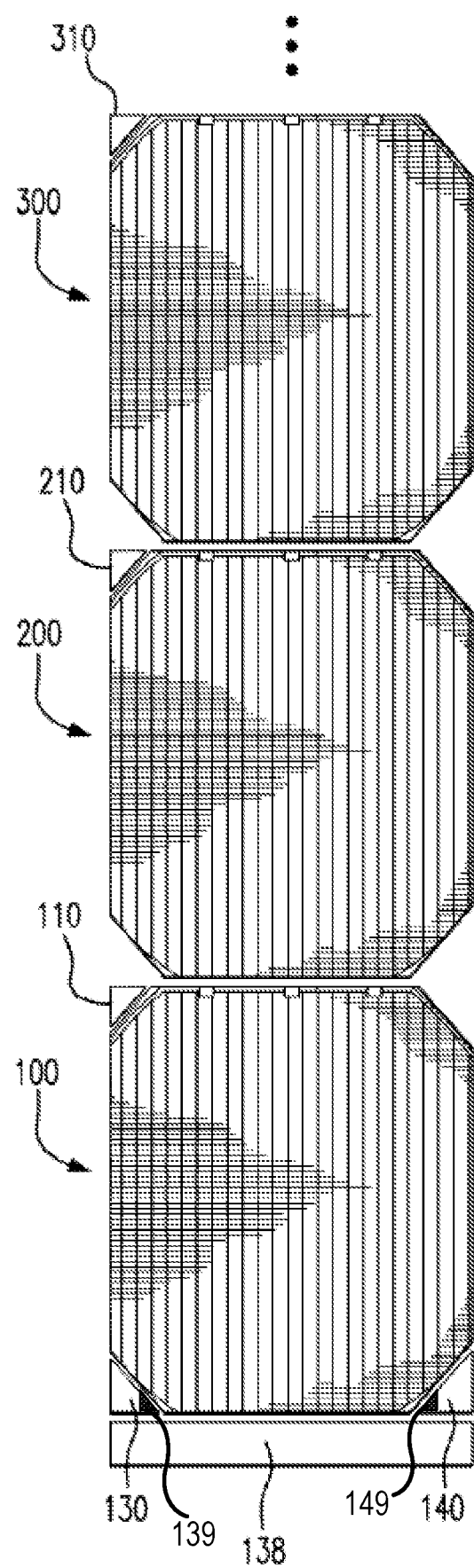
FIG. 3A schematically illustrates a solar cell array, according to an example.

FIG. 3A illustrates an array of solar cells comprising a first string of series connected solar cells 100, 200 and 300 each provided with a bypass diode 110, 210, 310. The bypass diode is placed in correspondence with a cropped corner of the respective solar cell, thus making use of the space that is left free between adjacent solar cells due to the cropped corners, as shown in FIG. 3A. Solar cells 100, 200 and 300 are connected in series to form a string. The string can comprise a large number of solar cells, and the solar cell assembly or array can comprise a large number of strings.

FIG. 3A further illustrates how the string of series connected solar cells 100, 200 and 300 is connected to the metal bus bar 138 through two blocking diodes 130 and 140. A first terminal of the blocking diodes 130, 140 may be connected to a terminal of the solar cell 100 and a second terminal of the blocking diodes 130,140 may be connected to the metal bus bar 138, respectively. The metal bus bar 138 may thus be considered a terminal of the array or of the string of series connected solar cells. Resistive elements 139 and 149 are connected in parallel to the blocking diodes 130 and 140, respectively, for the string of series connected solar cells 100, 200 and 300. The resistive elements 139, 149 may be connected between the first terminal of the blocking diode and said one end of the string of series connected solar cells. The resistive elements 139, 149 may be conductive polyimide films. During normal operation, the current would flow through the blocking diode and only a small portion would pass through the resistive element. However, if an overvoltage situation would occur in the string of series connected solar cells the current would flow through the resistive element thus protecting the cells.

Figure 3B:
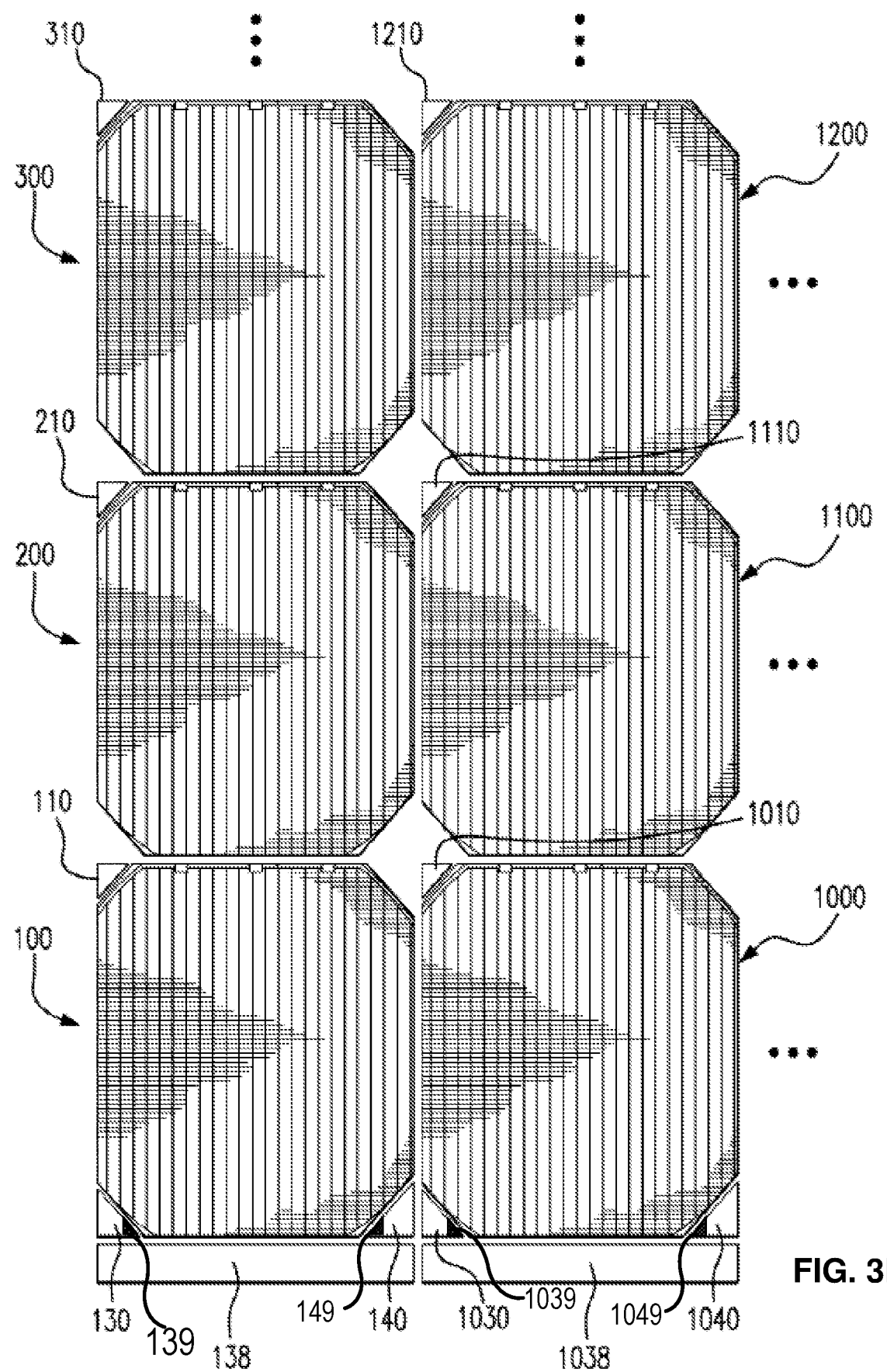
FIG. 3B schematically illustrates a solar cell assembly, according to an example.

FIG. 3B illustrates an assembly of solar cells comprising a first string of series connected solar cells 100, 200 and 300 each provided with a bypass diode 110, 210, 310, and a second string of solar cells 1000, 1100, 1200, each provided with a bypass diode 1010, 1110, 1210. The bypass diode is placed in correspondence with a cropped corner of the respective solar cell, thus making use of the space that is left free between adjacent solar cells due to the cropped corners, as shown in FIG. 3B. Solar cells 100, 200 and 300 are connected in series, and so are solar cells 1000, 1100 and 1200. Each string can comprise a large number of solar cells, and the solar cell assembly can comprise a large number of strings. FIG. 3B further illustrates how the string of series connected solar cells 100, 200 and 300 is connected to the metal bus bar 138 through two blocking diodes 130 and 140, and how the string of series connected solar cells 1000, 1100 and 1200 is connected to the metal bus bar 1038 through two blocking diodes 1030 and 1040. The metal bus bars 138, 1038 may be considered terminals of the strings of series connected solar cells, respectively. Resistive elements 139 and 149 may be connected in parallel to the blocking diodes 130 and 140, respectively, for the string of series connected solar cells 100, 200 and 300. Accordingly, resistive elements 1039 and 1049 may be connected in parallel to the blocking diodes 1030 and 1040 for the string of series connected solar cells 1100, 1200 and 1300.

Figure 4:
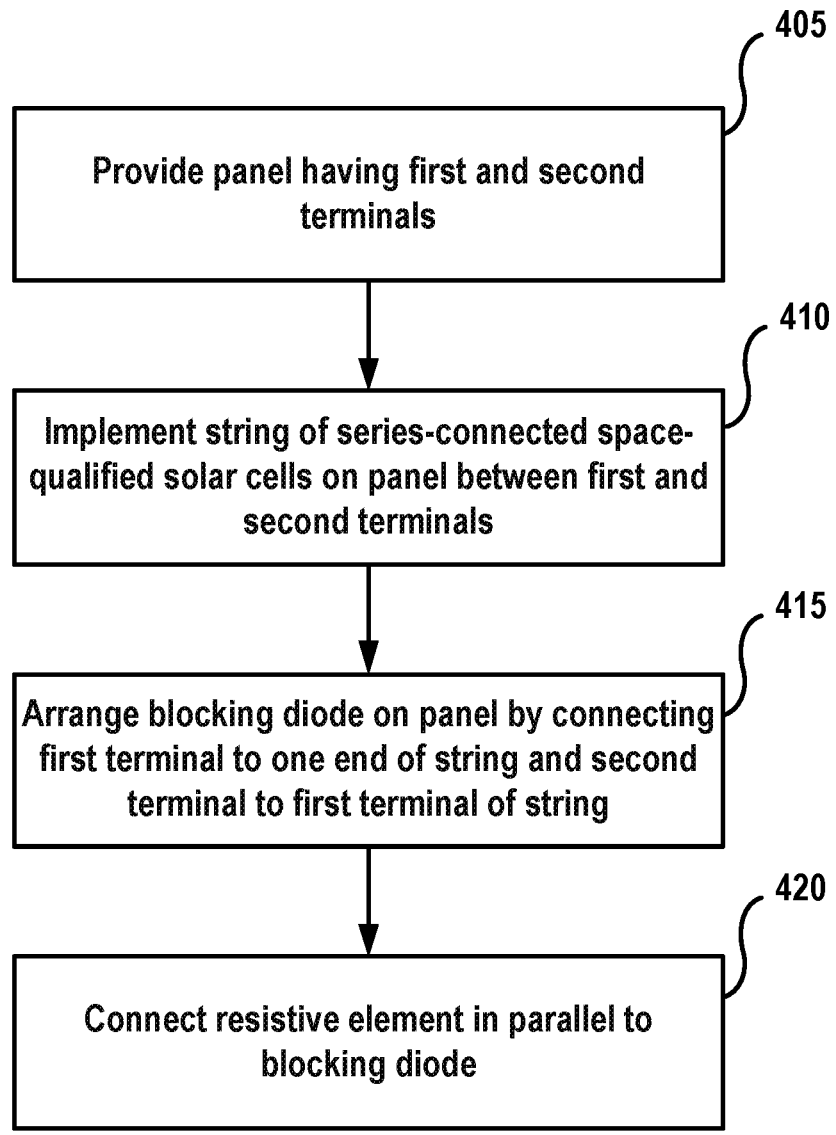
FIG. 4 is a flow diagram of a method of fabricating a space-qualified solar cell array.

FIG. 4 is a flow diagram of a method of fabricating a space-qualified solar cell array. In block 405, a panel having first and second terminals of opposite polarity type may be provided. In block 410, a string of series-connected space-qualified solar cells may be implemented on the panel and may be arranged between the first and second terminals. During operation, the string of solar cells may generate a peak voltage between 10 and 1000 volts. In block 415, a blocking diode may be arranged on the panel and may have a first terminal connected with one end of the string of series connected solar cells and a second terminal connected to the first terminal of the string of series connected solar cells. In block 420, a resistive element connected in parallel to the blocking diode may be provided between the first terminal and said one end of the string of series connected solar cells. The resistive element may provide a leakage current path in parallel with the blocking diode so as to prevent an electrostatic discharge between the terminals of the blocking diode due to the characteristics of the space environment in which the array may be deployed.

For reasons of completeness, various aspects of the present disclosure are set out in the following numbered clauses:

Clause 1. A solar cell array comprising: a support including first and second terminals of opposite polarity type; a string of series connected space-qualified solar cells arranged between the first and second terminals generating a peak voltage between 10 and 1000 volts; a blocking diode having a first terminal connected with one end of the string of series connected space-qualified solar cells and a second terminal connected to the first terminal of the string of series connected solar cells; and a resistive element connected in parallel to the blocking diode, between the first terminal of the blocking diode and said one end of the string of series connected solar cells for providing a leakage current path in parallel with the blocking diode so as to prevent an electrostatic discharge between the terminals of the blocking diode.

Clause 2. A solar cell array, according to clause 1, wherein the ohmic value of the resistive element is between 1K and 100M Ohm, and has a leakage current of from 10 microAmps to 10 milliAmps.

Clause 3. A solar cell array, according to clause 1, wherein the ohmic value of the resistive element is between 80K and 120K Ohm, and has a leakage current of from 0.5 to 1.5 milliAmps.

Clause 4. A solar cell array according to any of clauses 1-3, wherein the blocking diode is a planar blocking diode having a terminal of first polarity on a first surface, and a terminal of second polarity on the opposite second surface of the planar blocking diode and the surfaces are separated by distances in the range of 0.1 mm to 2.0 mm.

Clause 5. A solar cell array, according to clause 4, wherein the planar blocking diode is provided in a substantially triangular space of a cropped corner of one of the space-qualified solar cells.

Clause 6. A solar cell array according to clause 5, wherein the resistive element is a resistive paste positioned in parallel to the planar blocking diode in a portion of the triangular space and making contact with the first and second surfaces of the planar blocking diode, the resistive paste having a thickness between 3 and 6 mm.

Clause 7. A solar cell array according to clause 6, wherein the resistive paste is composed of carbon nanotubes.

Clause 8. A solar cell array according to clause 6, wherein the resistive paste is an electrically conductive silicone material having a volume resistivity of 25 Ohm-cm.

Clause 9. A solar cell array according to any of clauses 1-8, wherein the resistive element is a discrete packaged resistive element.

Clause 10. A solar cell array according to any of clauses 1-9, wherein the distance between the first and second terminals of the blocking diode is less than 2 mm.

Clause 11. A solar cell assembly comprising: a first string of series connected first space-qualified solar cells, one of said first space-qualified solar cells being a final first solar cell of the first string, said final first solar cell having a metal layer and at least a first oblique cut corner and a second oblique cut corner; and a first contact member electrically connected to said metal layer of said final first space-qualified solar cell; through a first blocking diode electrically connected in series, wherein a first terminal of said first blocking diode is electrically connected through a first interconnect to the first contact member, and a second terminal of said first blocking diode of opposite polarity is directly electrically connected to a first connector that is also directly electrically connected to said metal layer of said final first space-qualified solar cell at said first oblique cut corner, with the first blocking diode being positioned in the region defined by said first oblique cut corner; and a resistive element connected in parallel with the first blocking diode to provide a small current leakage path to prevent an electrostatic discharge across the terminals of the first blocking diode arising from the array operating in the space environment where electron and proton particle irradiation is experienced.

Clause 12. The solar cell assembly of clause 11, further comprising a second blocking diode electrically connected in series, wherein a first terminal of said second blocking diode is electrically connected through a second interconnect to the first contact member, and a terminal of said blocking diode of opposite polarity is directly electrically connected to the first connector that is also directly electrically connected to said metal layer of said final solar cell at said second oblique cut corner, with the second blocking diode being positioned in the region defined by said second oblique cut corner.

Clause 13. The solar cell assembly of clause 11 or 12, wherein said first blocking diode is a planar diode having a terminal of first polarity on a first surface, and a terminal of second polarity on the opposite second surface of the planar diode and the surfaces are separated by distances in the range of 0.1 mm to 2.0 mm, and has a substantially triangular shape adapted to fit into a space left free by said first oblique cut corner, and the ohmic value of the resistive element is between 1K and 100M Ohm, and has a leakage current of from 10 microAmps to 10 milliAmps.

Clause 14. The solar cell assembly of any of clauses 11-13, wherein said first contact member is a metal bus bar, and the resistive element is a conductive polyimide film.

Clause 15. The solar cell assembly of any of clauses 11-14, further comprising a second string of series connected second solar cells, one of said second space-qualified solar cells being a final second space-qualified solar cell of the second string having a metal layer and at least one oblique cut corner, said final second space-qualified solar cell being connected to a second contact member through a third blocking diode electrically connected in series, wherein a first connection of said third blocking diode is electrically connected through a third interconnect to the second contact member, and a second connection of said third blocking diode is directly electrically connected to a second connector that is also directly electrically connected to said metal layer of said final second space-qualified solar cell at said at least one oblique cut corner, with the third blocking diode being positioned proximate said at least one oblique cut corner, the final first solar cell and the final second space-qualified solar cell being placed adjacent to each other, and said first blocking diode and said third blocking diode being placed adjacent to each other.

Clause 16. The solar cell assembly of clause 15, wherein said first blocking diode and said third blocking diode each have a substantially triangular or rectangular shape and have surfaces separated by a distance between 0.1 mm and 1.0 mm.

Clause 17. A solar cell assembly comprising a plurality of solar cells arranged adjacent to each other in rows and columns forming an array, each solar cell having a substantially rectangular shape with four oblique cut corners, each solar cell of the plurality of said solar cells being connected to a bypass diode arranged in correspondence with a first oblique cut corner of the respective solar cell and arranged in a space provided between adjacent solar cells at the oblique cut corners of the solar cells, said solar cell assembly further comprising at least a first contact member arranged to collect current from a first portion of the plurality of said solar cells that are arranged in series to form a first string, at least one solar cell having a metal layer and being electrically connected to said first contact member (i) through a first blocking diode electrically connected in series, wherein a first connection of said first blocking diode is electrically connected through a first interconnect to said first contact member, and a second connection of said first blocking diode is directly electrically connected to a first connector that is also directly electrically connected to said metal layer of the at least one solar cell at a second oblique cut corner, the first blocking diode being placed in a space provided between said at least one solar cell and the first contact member, adjacent the second oblique cut corner of said at least one solar cell; and (ii) through a second blocking diode electrically connected in series, wherein a first connection of said second blocking diode is electrically connected through a second interconnect to said first contact member, and a second connection of said second blocking diode is directly electrically connected to the first connector that is also directly electrically connected to said metal layer of the at least one solar cell at a third oblique cut corner, the second blocking diode being placed in a space provided between said at least one solar cell and the first contact member, adjacent the third oblique cut corner of said at least one solar cell.

Clause 18. The solar cell assembly of clause 17, further comprising a second contact member arranged to collect current from a second portion of the plurality of said solar cells that are arranged in series to form a second string, at least one solar cell of the second string having a metal layer and being connected to said second contact member through a third blocking diode electrically connected in series, wherein a first connection of said third blocking diode is electrically connected through a third interconnect to said second contact member, and a second connection of said third blocking diode is directly electrically connected to a second connector that is also directly electrically connected to the metal layer of the at least one solar cell of the second string at a second oblique cut corner, the third blocking diode being placed in a space provided between said at least one solar cell of the second string and the second contact member, adjacent the second oblique cut corner of said at least one solar cell of the second string, wherein the first and third blocking diodes are placed in a space between two adjacent solar cells belonging to the first string and the second string.

Clause 19. A solar cell assembly according to clause 17 or 18, wherein a resistive element is positioned in parallel to the blocking diode in a portion of the triangular space and making contact with the first and second surfaces of the planar diode, the resistive element having a thickness between 3 and 6 mm, and comprising an electrically conductive silicone material having a volume resistivity of 25 ohm-cm.

Clause 20. A method of fabricating a space-qualified solar cell array comprising: providing a panel having first and second terminals of opposite polarity type; implementing on the panel a string of series-connected space-qualified solar cells arranged between the first and second terminals, the string of solar cells generating a peak voltage between 10 and 1000 volts; arranging a blocking diode on the panel and having a first terminal connected with one end of the string of series connected solar cells and a second terminal connected to the first terminal of the string of series connected solar cells; and providing a resistive element connected in parallel to the blocking diode, between the first terminal and said one end of the string of series connected solar cells for providing a leakage current path in parallel with the blocking diode so as to prevent an electrostatic discharge between the terminals of the blocking diode due to the characteristics of the space environment in which the array is deployed.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples, but should be determined only by a fair reading of the claims that follow. If reference signs related to drawings are placed in parentheses in a claim, they are solely for attempting to increase the intelligibility of the claim, and shall not be construed as limiting the scope of the claim.

The invention claimed is:
1. A solar cell array comprising:
a support including first and second terminals of opposite polarity type;

a string of series connected space-qualified solar cells arranged between the first and second terminals generating a peak voltage between 10 and 1000 volts;

a blocking diode having a first blocking diode terminal connected with one end of the string of series connected space-qualified solar cells and a second blocking diode terminal connected to the first terminal of the string of series connected solar cells; and a resistive element connected in parallel to the blocking diode, between the first blocking diode terminal and said one end of the string of series connected solar cells for providing a leakage current path in parallel with the blocking diode so as to prevent an electrostatic discharge between the first and second terminals of the blocking diode.

2. A solar cell array, according to claim 1, wherein the ohmic value of the resistive element is between 1K and 100M Ohm, and has a leakage current from 10 microAmps to 10 milliAmps.

3. A solar cell array, according to claim 1, wherein the ohmic value of the resistive element is between 80K and 120K Ohm, and has a leakage current from 0.5 to 1.5 milliAmps.

4. A solar cell array according to claim 1, wherein the blocking diode is a planar blocking diode having the first blocking diode terminal of first polarity on a first surface, and the second blocking diode terminal of second polarity on the opposite second surface of the planar blocking diode and the surfaces are separated by distances in the range of 0.1 mm to 2.0 mm.

5. A solar cell array, according to claim 4, wherein the planar blocking diode is provided in a substantially triangular space of a cropped corner of one of the space-qualified solar cells.

6. A solar cell array according to claim 5, wherein the resistive element is a resistive paste positioned in parallel to the planar blocking diode in a portion of the triangular space and making contact with the first and second surfaces of the planar blocking diode, the resistive paste having a thickness between 3 and 6 mm.

7. A solar cell array according to claim 1, wherein the resistive element is a discrete packaged resistive element.

8. A solar cell array according to claim 1, wherein the distance between the first and second terminals of the blocking diode is less than 2 mm.

9. A solar cell array according to claim 6, wherein the resistive paste is composed of carbon nanotubes.

10. A solar cell array according to claim 6, wherein the resistive paste is an electrically conductive silicone material having a volume resistivity of 25 Ohm-cm.

11. A solar cell assembly comprising:

a first string of series connected first space-qualified solar cells, one of said first space-qualified solar cells being a final first solar cell of the first string, said final first solar cell having a metal layer and at least a first oblique cut corner and a second oblique cut corner; and a first contact member electrically connected to said metal layer of said final first space-qualified solar cell; through a first blocking diode electrically connected in series, wherein a first blocking diode terminal of said first blocking diode is electrically connected through a first interconnect to the first contact member, and a second blocking diode terminal of said first blocking diode of opposite polarity is directly electrically connected to a first connector that is also directly electrically connected to said metal layer of said final first space-qualified solar cell at said first oblique cut corner, with the first blocking diode being positioned in the region defined by said first oblique cut corner; and a resistive element connected in parallel with the first blocking diode to provide a small current leakage path to prevent an electrostatic discharge across the terminals of the first blocking diode arising from the array operating in the space environment where electron and proton particle irradiation is experienced.

12. The solar cell assembly of claim 11, further comprising a second blocking diode electrically connected in series with the first string of series connected first space-qualified solar cells, wherein a first blocking diode terminal of said second blocking diode is electrically connected through a second interconnect to the first contact member, and a second blocking diode terminal of said blocking diode of opposite polarity is directly electrically connected to the first connector that is also directly electrically connected to said metal layer of said final solar cell at said second oblique cut corner, with the second blocking diode being positioned in the region defined by said second oblique cut corner.

13. The solar cell assembly of claim 11, wherein said first blocking diode is a planar diode having the first blocking diode terminal of first polarity on a first surface, and a second blocking diode terminal of second polarity on the opposite second surface of the planar diode and the surfaces are separated by distances in the range of 0.1 mm to 2.0 mm, and has a substantially triangular shape adapted to fit into a space left free by said first oblique cut corner, and the ohmic value of the resistive element is between 1K and 100M Ohm, and has a leakage current from 10 microAmps to 10 milliAmps.

14. The solar cell assembly of claim 11, wherein said first contact member is a metal bus bar, and the resistive element is a conductive polyimide film.

15. The solar cell assembly of claim 12, further comprising a second string of series connected second solar cells, one of said second space-qualified solar cells being a final second space-qualified solar cell of the second string having a metal layer and at least one oblique cut corner, said final second space-qualified solar cell being connected to a second contact member through a third blocking diode electrically connected in series, wherein a first connection of said third blocking diode is electrically connected through a third interconnect to the second contact member, and a second connection of said third blocking diode is directly electrically connected to a second connector that is also directly electrically connected to said metal layer of said final second space-qualified solar cell at said at least one oblique cut corner, with the third blocking diode being positioned proximate said at least one oblique cut corner, the final first solar cell and the final second space-qualified solar cell being placed adjacent to each other, and said first blocking diode and said third blocking diode being placed adjacent to each other.

16. The solar cell assembly of claim 15, wherein said first blocking diode and said third blocking diode each have a substantially triangular or rectangular shape and have surfaces separated by a distance between 0.1 mm and 1.0 mm.

17. A solar cell assembly comprising a plurality of solar cells arranged adjacent to each other in rows and columns forming an array, each solar cell having a substantially rectangular shape with four oblique cut corners, each solar cell of the plurality of said solar cells being connected to a bypass diode arranged in correspondence with a first oblique cut corner of the respective solar cell and arranged in a space provided between adjacent solar cells at the oblique cut corners of the solar cells, said solar cell assembly further comprising at least a first contact member arranged to collect current from a first portion of the plurality of said solar cells that are arranged in series to form a first string, at least one solar cell having a metal layer and being electrically connected to said first contact member (i) through a first blocking diode electrically connected in series, wherein a first connection of said first blocking diode is electrically connected through a first interconnect to said first contact member, and a second connection of said first blocking diode is directly electrically connected to a first connector that is also directly electrically connected to said metal layer of the at least one solar cell at a second oblique cut corner, the first blocking diode being placed in a space provided between said at least one solar cell and the first contact member, adjacent the second oblique cut corner of said at least one solar cell; and (ii) through a second blocking diode electrically connected in series, wherein a first connection of said second blocking diode is electrically connected through a second interconnect to said first contact member, and a second connection of said second blocking diode is directly electrically connected to the first connector that is also directly electrically connected to said metal layer of the at least one solar cell at a third oblique cut corner, the second blocking diode being placed in a space provided between said at least one solar cell and the first contact member, adjacent the third oblique cut corner of said at least one solar cell, wherein a resistive element is positioned in parallel to each blocking diode to provide a small current leakage path to prevent an electrostatic discharge across the terminals of the first blocking diode arising from the array operating in the space environment where electron and proton particle irradiation is experienced.

18. The solar cell assembly of claim 17, further comprising a second contact member arranged to collect current from a second portion of the plurality of said solar cells that are arranged in series to form a second string, at least one solar cell of the second string having a metal layer and being connected to said second contact member through a third blocking diode electrically connected in series, wherein a first connection of said third blocking diode is electrically connected through a third interconnect to said second contact member, and a second connection of said third blocking diode is directly electrically connected to a second connector that is also directly electrically connected to the metal layer of the at least one solar cell of the second string at a second oblique cut corner, the third blocking diode being placed in a space provided between said at least one solar cell of the second string and the second contact member, adjacent the second oblique cut corner of said at least one solar cell of the second string, wherein the first and third blocking diodes are placed in a space between two adjacent solar cells belonging to the first string and the second string.

19. A solar cell assembly according to claim 17, wherein each resistive element is positioned in a portion of the triangular space and making contact with the first and second surfaces of the planar diode, the resistive element having a thickness between 3 and 6 mm, and comprising an electrically conductive silicone material having a volume resistivity of 25 ohm-cm.

20. A method of fabricating a space-qualified solar cell array comprising:

providing a panel having first and second terminals of opposite polarity type;

implementing on the panel a string of series-connected space-qualified solar cells arranged between the first and second terminals, the string of solar cells generating a peak voltage between 10 and 1000 volts;

arranging a blocking diode on the panel and having a first blocking diode terminal connected with one end of the string of series connected solar cells and a second blocking diode terminal connected to the first terminal of the string of series connected solar cells; and providing a resistive element connected in parallel to the blocking diode, between the first blocking diode terminal and said one end of the string of series connected solar cells for providing a leakage current path in parallel with the blocking diode so as to prevent an electrostatic discharge between the terminals of the blocking diode due to the characteristics of the space environment in which the array is deployed.

\* \* \* \* \*